(12) United States Patent
Ariga et al.

(10) Patent No.: US 11,903,125 B2
(45) Date of Patent: Feb. 13, 2024

(54) OPTICAL MODULE

(71) Applicant: FURUKAWA ELECTRIC CO., LTD., Tokyo (JP)

(72) Inventors: Maiko Ariga, Tokyo (JP); Yusuke Inaba, Tokyo (JP); Kazuki Yamaoka, Tokyo (JP); Atsushi Izawa, Tokyo (JP); Kazuya Nagashima, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 133 days.

(21) Appl. No.: 17/478,030

(22) Filed: Sep. 17, 2021

(65) Prior Publication Data

US 2022/0007496 A1 Jan. 6, 2022

Related U.S. Application Data

(63) Continuation of application No. PCT/JP2020/013758, filed on Mar. 26, 2020.

(30) Foreign Application Priority Data

Mar. 28, 2019 (JP) ................................. 2019-064181

(51) Int. Cl.
*H05K 1/02* (2006.01)
*H01S 5/02218* (2021.01)

(52) U.S. Cl.
CPC ......... *H05K 1/028* (2013.01); *H01S 5/02218* (2021.01); *H05K 1/0274* (2013.01); *H05K 2201/10121* (2013.01)

(58) Field of Classification Search
CPC ................. H05K 1/028; H05K 1/0274; H05K 2201/10121; H01S 5/02218

USPC .......................................................... 361/749
See application file for complete search history.

(56) References Cited

U.S. PATENT DOCUMENTS

| 7,215,886 B2 * | 5/2007 | Maruyama .......... H01S 5/02212 398/117 |
| 2005/0244111 A1 | 11/2005 | Wolf et al. |
| 2012/0008289 A1 | 1/2012 | Aruga et al. |
| 2016/0374200 A1 | 12/2016 | Lee et al. |
| 2017/0336584 A1 | 11/2017 | Ariga et al. |

(Continued)

FOREIGN PATENT DOCUMENTS

| CN | 102313939 A | 1/2012 |
| CN | 204014251 U | 12/2014 |

(Continued)

OTHER PUBLICATIONS

International Search Report dated Jun. 2, 2020 in PCT/JP2020/013758, filed on March 26, 2020, 2 pages.

(Continued)

*Primary Examiner* — Binh B Tran
(74) *Attorney, Agent, or Firm* — Oblon, McClelland, Maier & Neustadt, L.L.P.

(57) ABSTRACT

An optical module includes a box-shaped housing with an optical element mounted therein. Further, a wiring substrate is bonded to a part of a surface of a housing part of the housing, and an electric wiring, which is formed in the wiring substrate or on a surface of the wiring substrate, and an electric wiring, which is introduced into the housing part or onto a surface of the housing part, are electrically connected to each other.

4 Claims, 13 Drawing Sheets

(56) References Cited

U.S. PATENT DOCUMENTS

2017/0339793 A1* 11/2017 Katayama .............. H05K 1/189
2018/0284476 A1* 10/2018 Minamisawa ....... H05K 1/0281

FOREIGN PATENT DOCUMENTS

| CN | 106257965 A | 12/2016 |
|---|---|---|
| JP | 2012-18289 A | 1/2012 |
| JP | 2018-107445 A | 7/2018 |
| WO | WO 2016/129277 A1 | 8/2016 |
| WO | WO 2016/129278 A1 | 8/2016 |

OTHER PUBLICATIONS

Chinese Office Action dated Nov. 8, 2023 in Chinese Patent Application No. 202080023768.4, w/English translation of the cover page and English translation of the main body thereof, 20 pages.

* cited by examiner

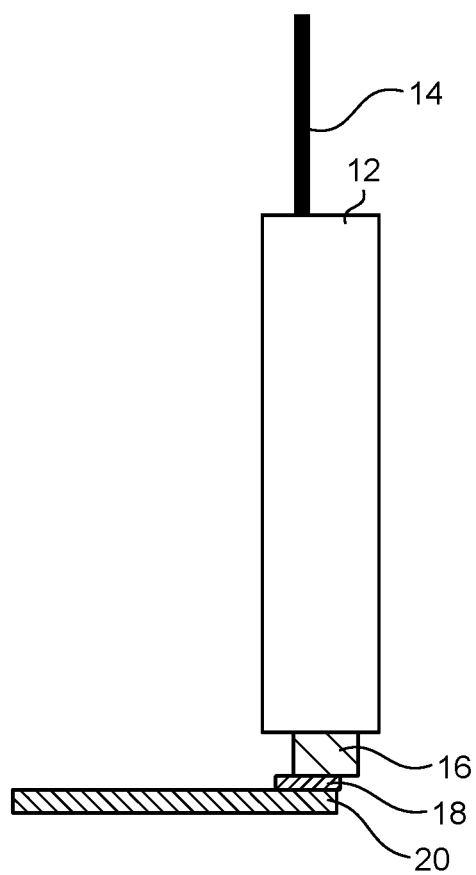

OPTICAL MODULE

CROSS-REFERENCE TO RELATED APPLICATION(S)

This application is a continuation of International Application No. PCT/JP2020/013758, filed on Mar. 26, 2020 which claims the benefit of priority of the prior Japanese Patent Application No. 2019-064181, filed on Mar. 28, 2019, the entire contents of which are incorporated herein by reference.

BACKGROUND

The present disclosure relates to optical modules used in optical communication.

In the related art, optical modules used in, for example, optical communication are known. Connection using lead pins has been adopted mainly for electrically conductive connection between an optical module and an external electronic substrate. Rigid substrates are used as substrates but flexible substrates have also started being adopted in recent years. When an optical module and an electronic substrate are to be electrically connected to each other, a method in which lead pins are connected to a rigid substrate by soldering is used (see, for example, Japanese Laid-open Patent Publication No. 2018-107445). In contrast, when a flexible substrate is used as the electronic substrate (see, for example, International Publication Nos. WO 2016/129277 and WO 2016/129278), in order to increase the reliability of electric conduction and connection strength, the electric conduction has been achieved by providing, in the flexible substrate, holes into which lead pins of an optical module are able to be inserted, placing electrodes for electric conduction around the holes, and fixing the electrodes and the lead pins inserted in the holes by soldering or electrically conductive resin.

SUMMARY

There is a need for providing an optical module which can be downsized.

According to an embodiment, an optical module includes a box-shaped housing with an optical element mounted therein. Further, a wiring substrate is bonded to a part of a surface of a housing part of the housing, and an electric wiring, which is formed in the wiring substrate or on a surface of the wiring substrate, and an electric wiring, which is introduced into the housing part or onto a surface of the housing part, are electrically connected to each other.

BRIEF DESCRIPTION OF THE DRAWINGS

FIG. 3B is a sectional side view illustrating a schematic configuration of the third embodiment of the optical module according to the present disclosure;

DETAILED DESCRIPTION

In the related art, in response to a demand for optical modules to be downsized, there is a recent demand for downsized electronic devices. However, lead pins have been a barrier to downsizing of optical modules. For example, if twenty lead pins each having a minimum width of approximately 0.2 mm and a minimum lead pin pitch of approximately 0.7 mm are to be placed at 0.7 mm pitches, the minimum size including round portions at four corners of the housing would be approximately 15 mm, and further downsizing is difficult.

Embodiments of an optical module according to the present disclosure will be described in detail on the basis of the drawings. The present disclosure is not limited by these embodiments.

First Embodiment

A first embodiment of the present disclosure will be described first.

Figure 1A:
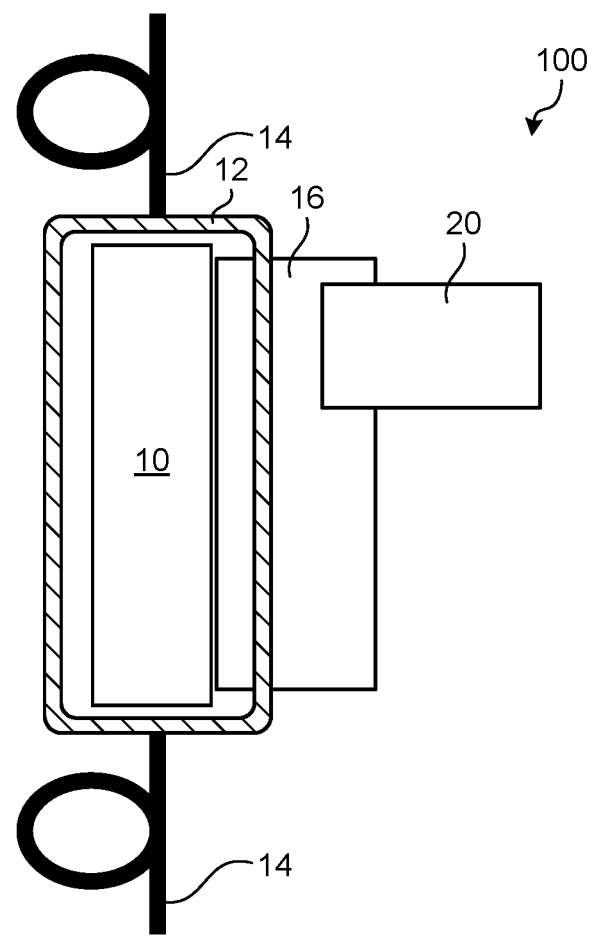
FIG. 1A is a sectional plan view illustrating a schematic configuration of a first embodiment of an optical module according to a present disclosure.
Figure 1B:
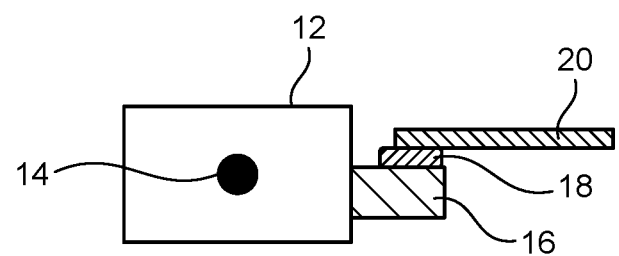
FIG. 1B is a sectional side view illustrating a schematic configuration of the first embodiment of the optical module according to the present disclosure.

As illustrated in FIG. 1A and FIG. 1B, an optical module 100 according to the first embodiment is an optical module having a housing 12 in which an optical modulator 10 (an optical element) has been installed, the housing 12 having a box shape that is approximately a rectangular parallelepiped. An optical fiber 14 has been connected to each of both ends of the housing 12, the ends being at ends of a longitudinal length of the housing 12. A feedthrough 16 (a housing part) that is ceramic extends externally from a longitudinal side of the housing 12, the feedthrough 16 forming the housing 12. An end portion of a wiring substrate 20 has been bonded to a part of an upper surface of an externally extended end portion of the feedthrough 16 by a bonding material 18. An electric wiring formed in the wiring substrate 20 or on a surface of the wiring substrate 20 and an electric wiring introduced into the feedthrough 16 or onto a surface of the feedthrough 16 have been electrically connected to each other. In FIG. 1A and FIG. 1B, the wiring substrate 20 has been illustrated short, but the actual wiring substrate 20 is a long substrate.

A flexible substrate may be used as the wiring substrate 20. The wiring substrate 20 is desirably formed using polyimide, a liquid crystal polymer, or polytetrafluoroethylene resin. In consideration of high frequency wirings, the electric wiring formed in or on the wiring substrate 20 is desirably a coplanar line, a microstrip line, or a coplanar line having a ground surface. The wiring substrate 20 may have a resin coating on all of surfaces of the wiring substrate 20, the surfaces excluding an electrically conductive pad provided at an end of the wiring substrate 20, the end being away from a position where the wiring substrate 20 is bonded to the surface of the feedthrough 16. Furthermore, the wiring substrate 20 may have the end subjected to corner rounding processing, the end being away from the position where the wiring substrate 20 is bonded to the surface of the feedthrough 16.

A signal line may be formed of a single line or differential lines. Plural lines may be arranged in an array. Furthermore, desirably, a sheet formed of organic matter is thermally bonded onto the signal line, an organic sheet is resin bonded onto the signal line, or the signal line has a resin coating thereon; ground surfaces have been formed on an upper surface of the sheet, the organic sheet, or the resin coating; and electrically conductive via holes are formed at narrow pitches of 0.03 mm to 5 mm between the two or three ground surfaces.

The bonding between the wiring substrate 20 and the feedthrough 16 is desirably bonding using soldering or an adhesive formed of electrically conductive resin. Epoxy resin, silicone resin, acrylic resin, or rubber resin is desirably used as a coating agent and the adhesive.

The above described configuration enables electric connection between the optical module 100 and the wiring substrate 20 without the use of lead pins in the related art. The optical module 100 is able to be downsized because its size is not constrained by, for example, dimensions of lead pins.

The inventors of the present disclosure have confirmed that, even in view of soldering, the diameter of the feedthrough 16 is able to be downsized to approximately 0.1 mm, and the pitches are able to be downsized to approximately 0.15 mm. Similarly, the inventors have confirmed that even if 20 feedthroughs 16 are arranged, the size is able to be downsized to 3 mm to 4 mm.

Therefore, because the design barrier due to the dimensions of parts is able to be removed, the design freedom is increased and designing with the optimum line widths and structures is enabled when high frequency electric conduction to electric lines is desired; leading to improvement of the high frequency characteristics.

Second Embodiment

A second embodiment of the present disclosure will be described next.

Figure 2A:
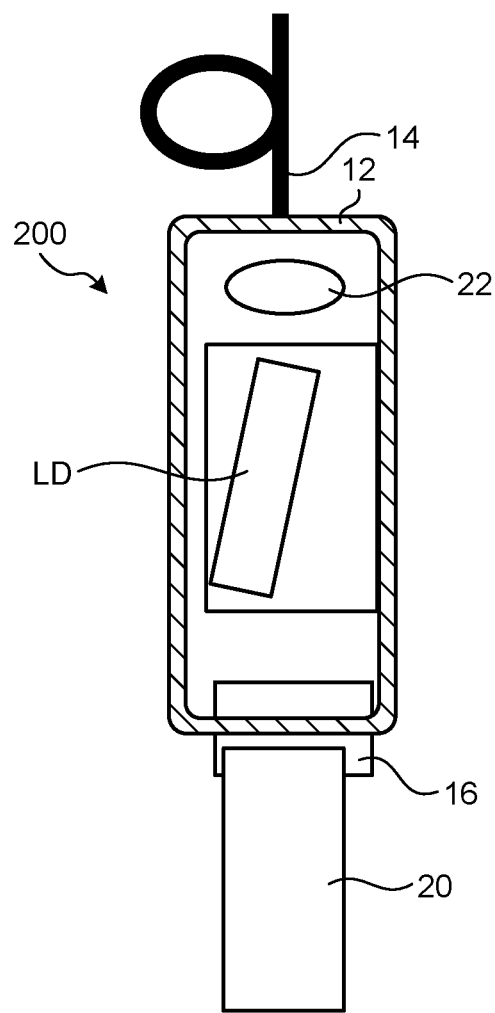
FIG. 2A is a sectional plan view illustrating a schematic configuration of a second embodiment of the optical module according to the present disclosure.
Figure 2B:
FIG. 2B is a sectional side view illustrating a schematic configuration of the second embodiment of the optical module according to the present disclosure.

As illustrated in FIG. 2A and FIG. 2B, an optical module 200 according to the second embodiment corresponds to a modified example of the first embodiment described above. This optical module 200 is an optical module having a housing 12 in which a semiconductor laser (LD) (an optical element) and a lens 22 have been installed, the housing 12 having a box shape that is approximately a rectangular parallelepiped. An optical fiber 14 is connected to one end of the housing 12, and a feedthrough 16 extends externally from the other end of the housing 12, the one end and the other end being at ends of a longitudinal length of the housing 12. Similarly to the above described first embodiment, an end portion of a wiring substrate 20 has been bonded to a portion of an upper surface of an externally extended end portion of the feedthrough 16 by a bonding material 18. An electric wiring formed in the wiring substrate 20 or on a surface of the wiring substrate 20 and an electric wiring introduced into the feedthrough 16 or onto a surface of the feedthrough 16 have been electrically connected to each other. This configuration also achieves effects similar to those of the first embodiment described above.

Third Embodiment

A third embodiment of the present disclosure will be described next.

Figure 3A:
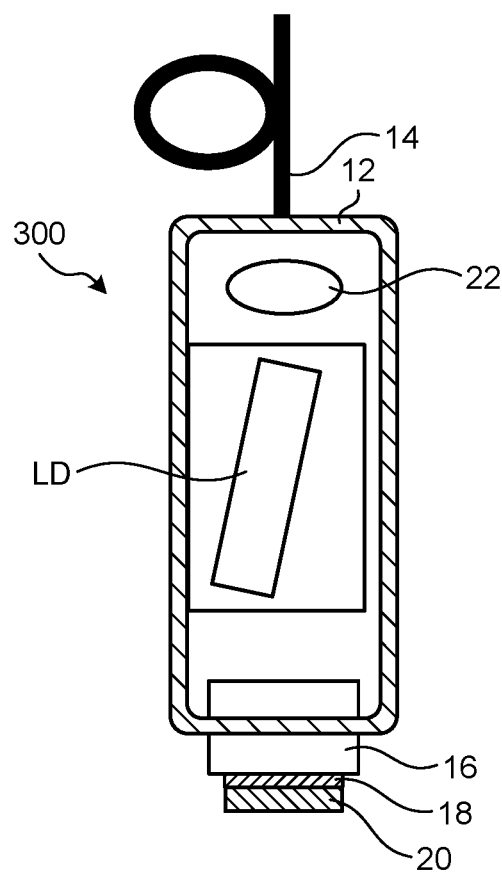
FIG. 3A is a sectional plan view illustrating a schematic configuration of a third embodiment of the optical module according to the present disclosure.

As illustrated in FIG. 3A and FIG. 3B, an optical module 300 according to the third embodiment corresponds to a modified example of the second embodiment described above. In the above described second embodiment, as illustrated in FIG. 2A and FIG. 2B, the feedthrough 16 extends externally along the longitudinal direction of the housing 12, and the wiring substrate 20 extending in the direction in which the feedthrough 16 extends has been bonded to the upper surface of the feedthrough 16 by the bonding material 18. Therefore, the upper surface of the feedthrough 16 and the surface of the wiring substrate 20 are in a parallel positional relation. In contrast, in this third embodiment, as illustrated in FIG. 3A and FIG. 3B, a feedthrough 16 extends externally along a longitudinal direction of a housing 12, and a wiring substrate 20 extending along a direction perpendicular to an upper surface of the feedthrough 16 has been bonded to an externally extended end surface of the feedthrough 16 by a bonding material 18. Therefore, the upper surface of the feedthrough 16 and the surface of the wiring substrate 20 are in a perpendicular positional relation. This configuration also achieves effects similar to those of the second embodiment described above.

Fourth Embodiment

A fourth embodiment of the present disclosure will be described next.

Figure 4A:
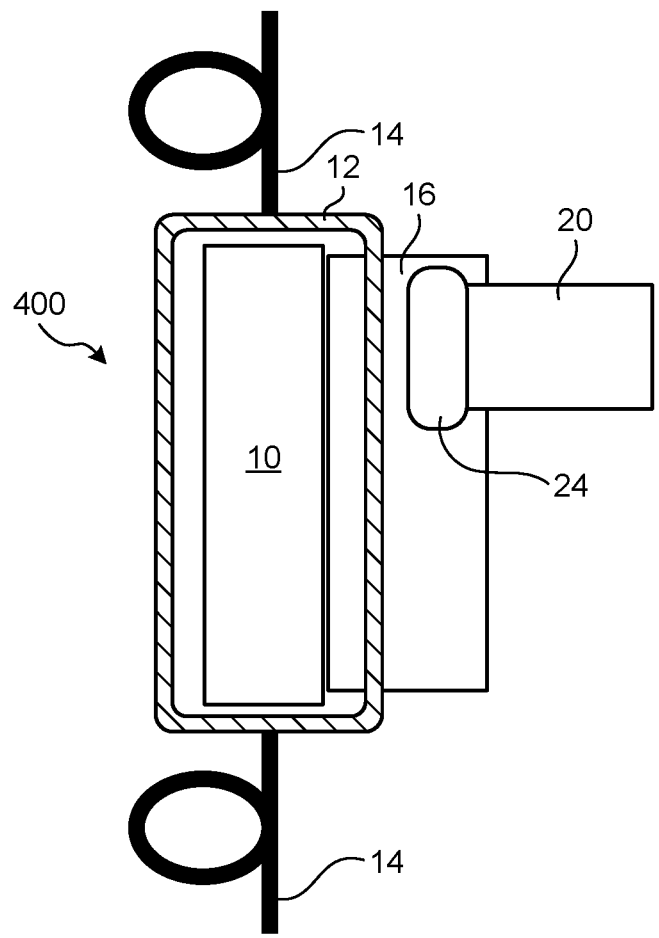
FIG. 4A is a sectional plan view illustrating a schematic configuration of a fourth embodiment of the optical module according to the present disclosure.
Figure 4B:
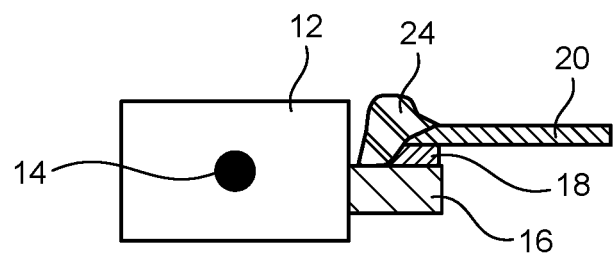
FIG. 4B is a sectional side view illustrating a schematic configuration of the fourth embodiment of the optical module according to the present disclosure.

As illustrated in FIG. 4A and FIG. 4B, an optical module 400 according to this fourth embodiment has a strength supporting resin 24 (a resin coating material) provided at a position where a wiring substrate 20 and a surface of a feedthrough 16 are bonded to each other, to cover the position, in contrast to the first embodiment described above. This strength supporting resin 24 is provided to contact both a part of the wiring substrate 20 and a part of the surface of the feedthrough 16. Because an upper surface portion at the bonded position is covered by the strength supporting resin 24, the bonding strength between the wiring substrate 20 and the feedthrough 16 is able to be improved. The strength supporting resin 24 desirably has a Young's modulus of 20 GPa or less. Furthermore, the strength supporting resin 24 desirably has a thickness of 10 µm or more. Epoxy resin, silicone resin, acrylic resin, or rubber resin may be used as the strength supporting resin 24.

Fifth Embodiment

A fifth embodiment of the present disclosure will be described next.

Figure 5A:
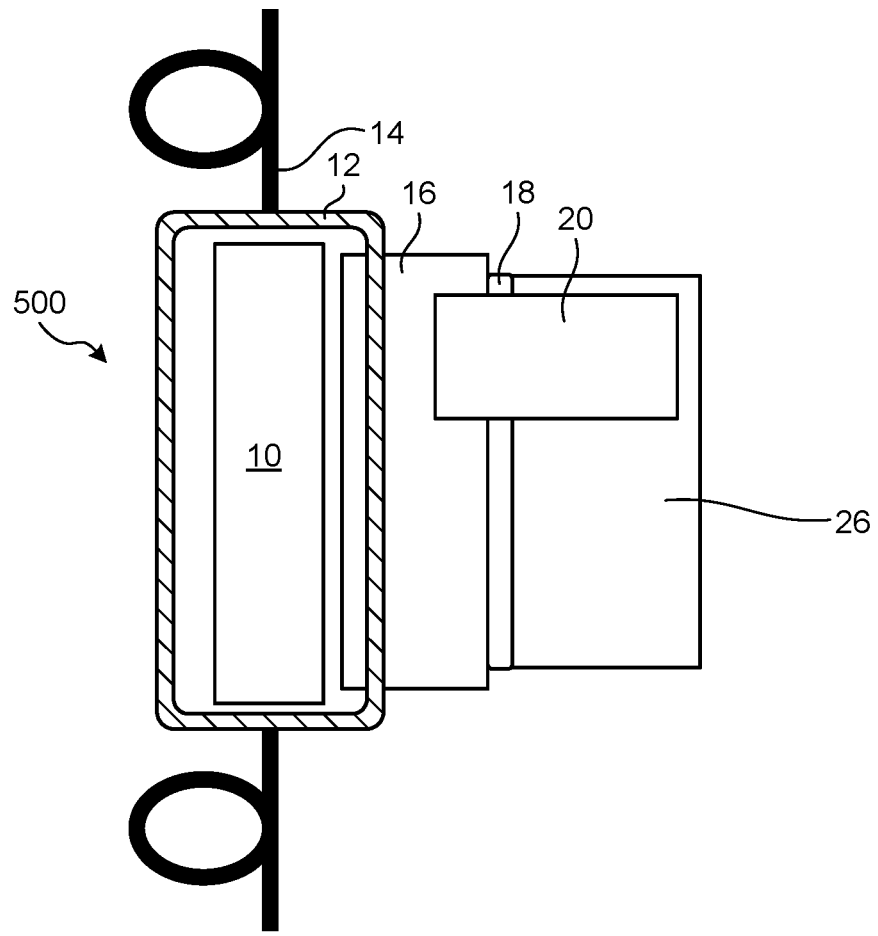
FIG. 5A is a sectional plan view illustrating a schematic configuration of a fifth embodiment of the optical module according to the present disclosure.
Figure 5B:
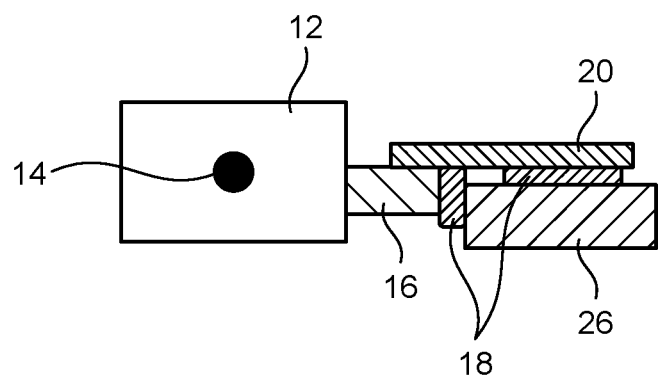
FIG. 5B is a sectional side view illustrating a schematic configuration of the fifth embodiment of the optical module according to the present disclosure.

As illustrated in FIG. 5A and FIG. 5B, an optical module 500 according to the fifth embodiment has a bonding supporting member 26 that has been bonded onto a back surface of a wiring substrate 20, and the bonding supporting member 26 and a feedthrough 16 have been bonded to each other, in contrast to the first embodiment described above. A bonding material 18, such as a resin adhesive or solder, may bond between the wiring substrate 20 and the bonding supporting member 26 and between the bonding supporting member 26 and the feedthrough 16. By this bonding, fixing on two planes or more is achieved and the bonding strength is thus able to be improved as compared to the first embodiment described above. In the case where a resin adhesive is used, epoxy resin, silicone resin, acrylic resin, or rubber resin is desirably used. In FIG. 5A and FIG. 5B, the wiring substrate 20 is illustrated shorter than the bonding supporting member 26 but the actual wiring substrate 20 is longer than the bonding supporting member 26.

Modified Example of Fifth Embodiment

By reference to FIG. 5A and FIG. 5B, the case where the feedthrough 16 and the bonding supporting member 26 are provided as separate members has been described as an example, but the present disclosure is not limited to this example. For example, the feedthrough 16 and the bonding supporting member 26 may be integrated with each other. The feedthrough 16 may, for example, include a portion like the bonding supporting member 26. Such a configuration also achieves effects similar to the effects described above.

Furthermore, in a case where an optical element where heat is generated, like a semiconductor laser (LD), is used like in the optical module 200 or 300, a metallic heat radiator may be placed above the optical module when the optical module is incorporated into a system. This heat radiator is placed to cover the optical module, for example. In this case, the wiring substrate 20 may be connected to the heat radiator, for example, such that the heat radiator functions as a supporting member. The heat radiator may be configured to press the wiring substrate 20 onto the feedthrough 16 by means of an extending portion provided in the heat radiator, for example, the extending portion extending toward the wiring substrate 20. Such a configuration also achieves effects similar to the effects described above.

Sixth Embodiment

A sixth embodiment of the present disclosure will be described next.

Figure 6A:
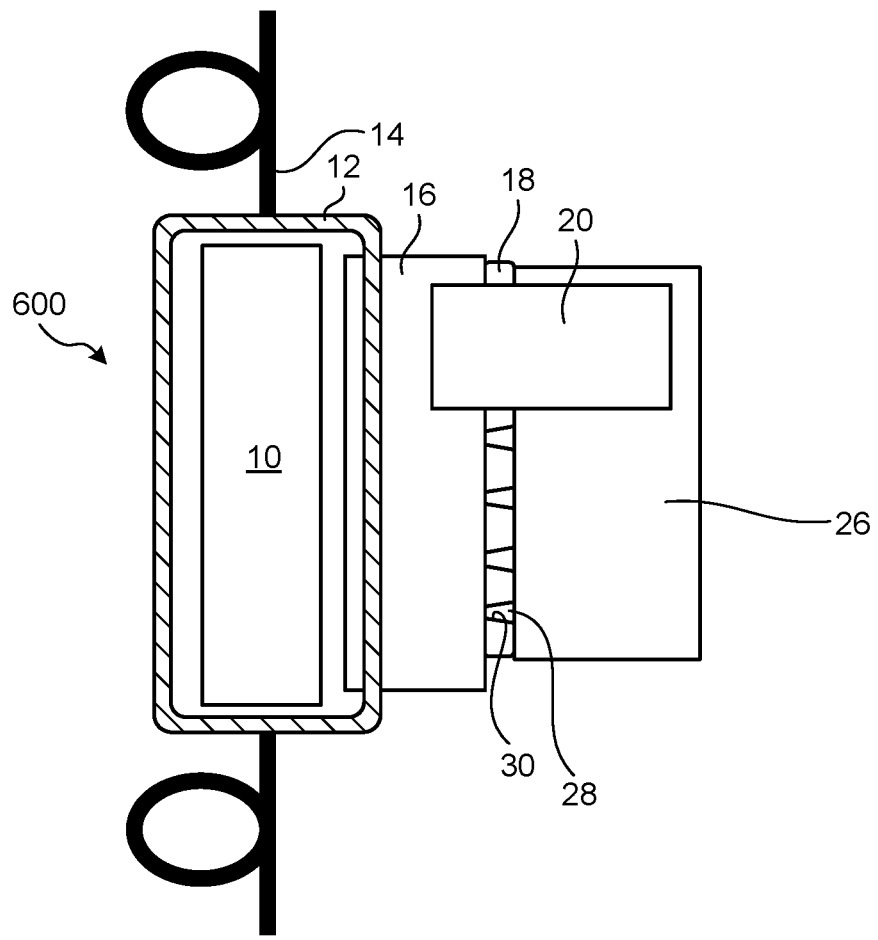
FIG. 6A is a sectional plan view illustrating a schematic configuration of a sixth embodiment of the optical module according to the present disclosure.
Figure 6B:
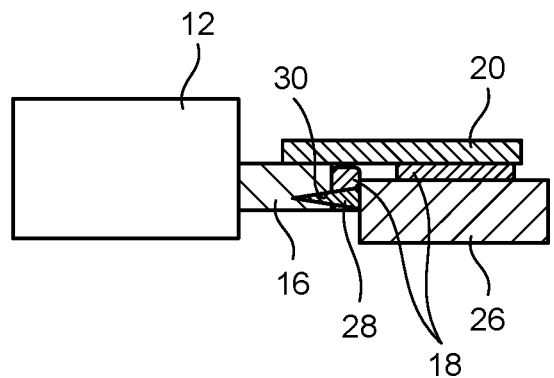
FIG. 6B is a sectional side view illustrating a schematic configuration of the sixth embodiment of the optical module according to the present disclosure.

As illustrated in FIG. 6A and FIG. 6B, an optical module 600 according to the sixth embodiment has projections or pole-shaped portions 28 provided in a bonding supporting member 26 and engaged with a feedthrough 16, in contrast to the fifth embodiment described above. Plural projections or pole-shaped portions 28 are formed on an end face of the bonding supporting member 26, the end face facing the feedthrough 16. Groove-shaped, dent-shaped, or hole-shaped hollow portions 30 have also been formed at corresponding positions on an end face of the feedthrough 16. Structuring the projections or pole-shaped portions 28 of the bonding supporting member 26 to be fitted into the groove-shaped, dent-shaped, or hole-shaped hollow portions 30 of the feedthrough 16 enables the bonding strength to be improved. In this case, in addition to the improvement of the bonding strength, positioning is also facilitated, and degradation of electric properties due to displacement is thus able to be prevented also. The projections or pole-shaped portions 28 may be inserted into the groove-shaped, dent-shaped, or hole-shaped hollow portions 30 and the projections or pole-shaped portions 28 and the groove-shaped, dent-shaped, or hole-shaped hollow portions 30 may be bonded to each other by a resin adhesive or solder. This will improve the bonding strength even more. Furthermore, in FIG. 6A and FIG. 6B, the wiring substrate 20 is illustrated shorter than the bonding supporting member 26 but the actual wiring substrate 20 is longer than the bonding supporting member 26.

Seventh Embodiment

A seventh embodiment of the present disclosure will be described next.

Figure 7A:
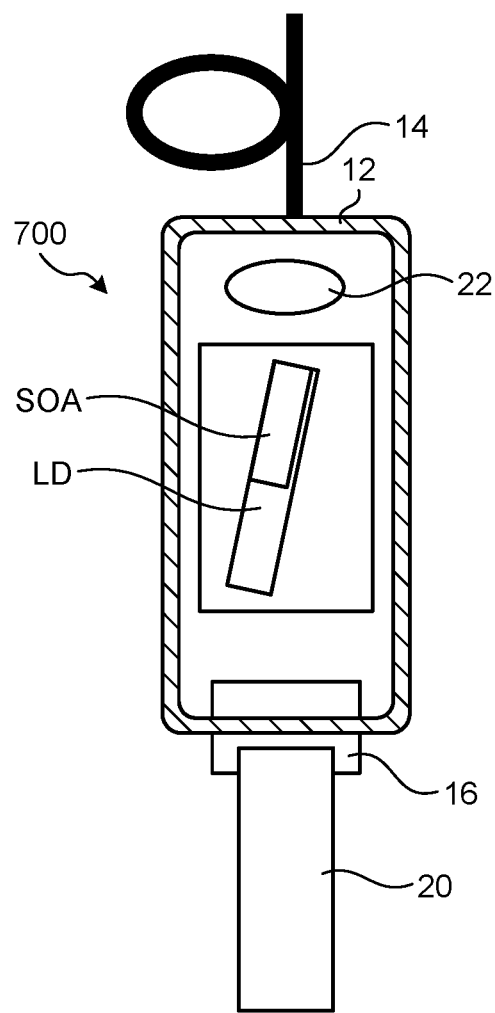
FIG. 7A is a sectional plan view illustrating a schematic configuration of a seventh embodiment of the optical module according to the present disclosure.
Figure 7B:
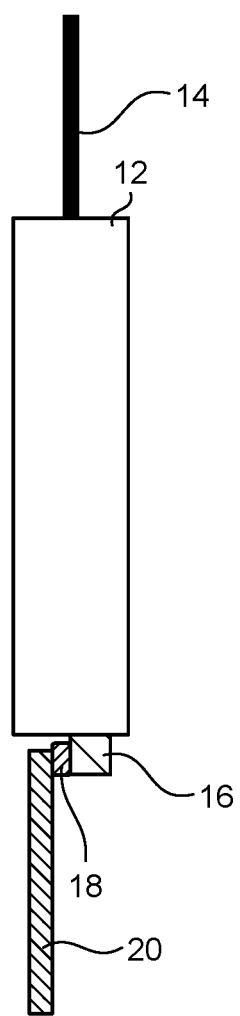
FIG. 7B is a sectional side view illustrating a schematic configuration of the seventh embodiment of the optical module according to the present disclosure.

As illustrated in FIG. 7A and FIG. 7B, an optical module 700 according to the seventh embodiment corresponds to a modified example of the second embodiment described above. This optical module 700 is an optical module having a housing 12 that is box-shaped, the housing 12 having a semiconductor laser (LD) (an optical element) and a lens 22 that are installed in the housing 12, the semiconductor laser having a semiconductor optical amplifier (SOA). The optical module 700 has a function of amplifying laser light output from the semiconductor laser (LD) by means of the semiconductor optical amplifier (SOA) and outputting the amplified laser light from an optical fiber 14. In this case where the semiconductor laser (LD) having the semiconductor optical amplifier (SOA) is installed as the optical element, effects similar to those of the second embodiment described above are also able to be achieved.

Eighth Embodiment

An eighth embodiment of the present disclosure will be described next.

Figure 8A:
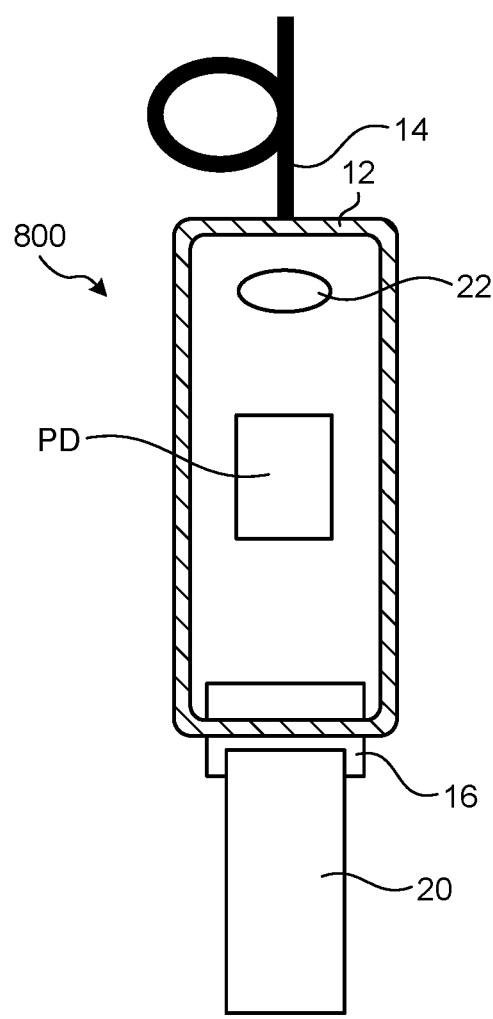
FIG. 8A is a sectional plan view illustrating a schematic configuration of an eighth embodiment of the optical module according to the present disclosure.
Figure 8B:
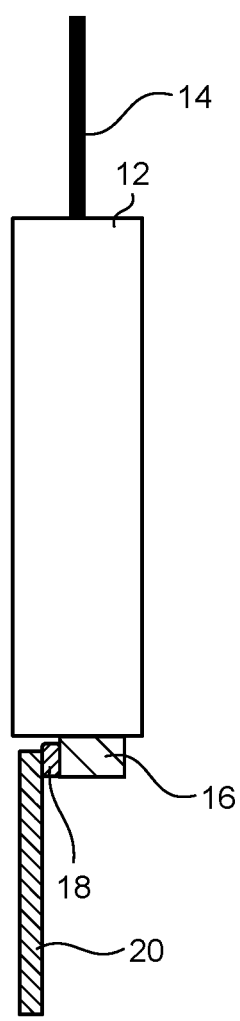
FIG. 8B is a sectional side view illustrating a schematic configuration of the eighth embodiment of the optical module according to the present disclosure.

As illustrated in FIG. 8A and FIG. 8B, an optical module 800 according to the eighth embodiment corresponds to a modified example of the second embodiment described above. This optical module 800 is an optical module having a housing 12 that is box-shaped, the housing 12 having a semiconductor light receiving element (PD) (an optical element) and a lens 22 that are installed in the housing 12. The optical module 800 has a function of condensing light input from an optical fiber 14 by means of a lens 22 and receiving the condensed light by means of the semiconductor light receiving element (PD). In this case where the semiconductor light receiving element (PD) is installed as the optical element, effects similar to those of the second embodiment described above are also able to be achieved.

Ninth Embodiment

Figure 9:
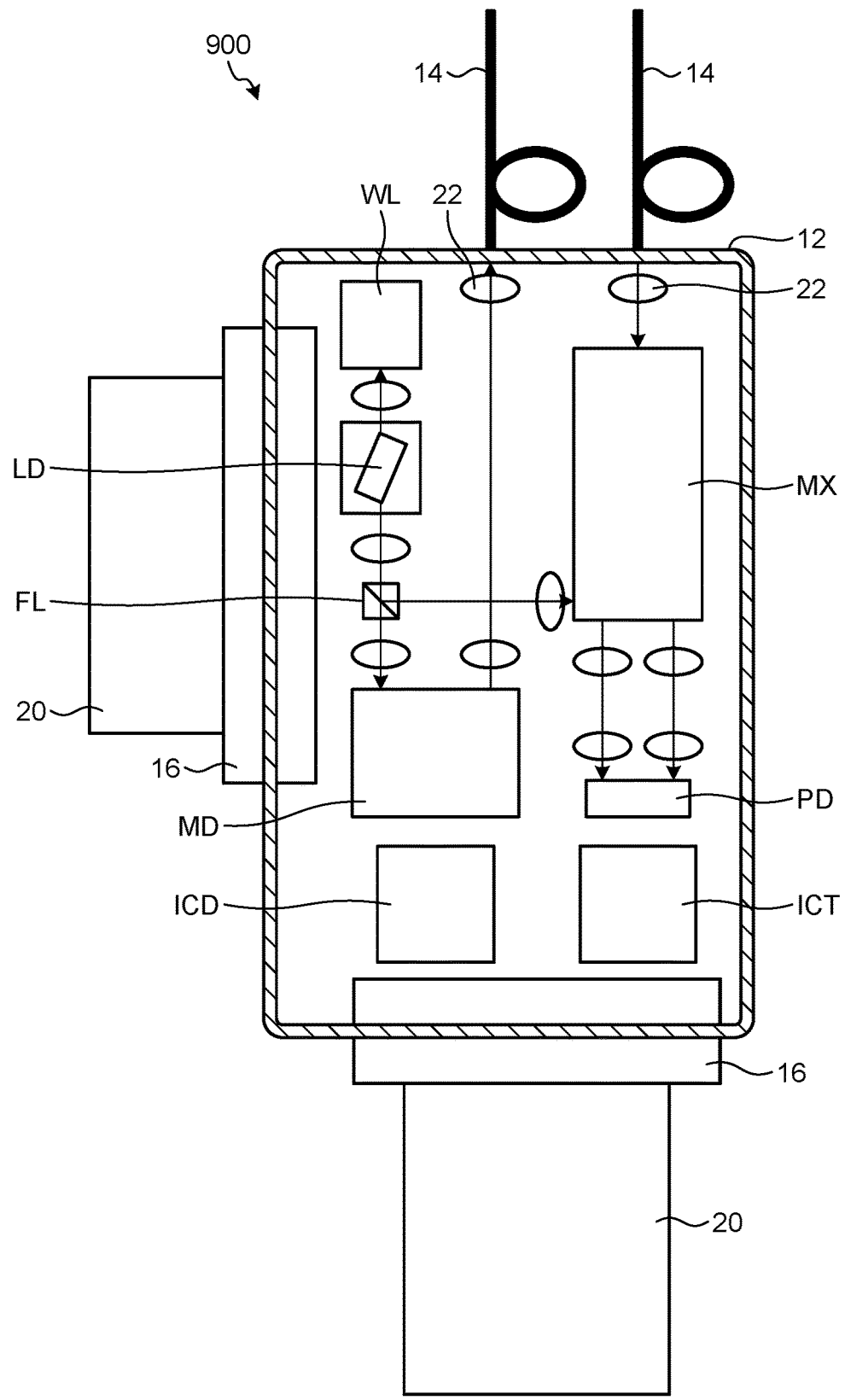
FIG. 9 is a schematic diagram illustrating a ninth embodiment of the optical module according to the present disclosure.

As illustrated in FIG. 9, an optical module 900 according to a ninth embodiment corresponds to a modified example of the second embodiment described above. The optical module 900 includes a coherent mixer (MX), a balance-type semiconductor light receiving element (PD), a transimpedance amplifier IC (TIA-IC, or ICT), an optical modulator (MD), a driver IC (ICD), a beam splitter (FL), a wavelength locker (WL), and a semiconductor laser (LD), for example. Furthermore, the optical module 900 includes two wiring substrates 20. One of the wiring substrates 20 is for high frequency signals like RF signals, and the other one of the wiring substrates 20 is for low frequency signals like DC signals. The optical module 900 is a module called an integrated coherent transmitter-receiver optical sub-assembly (IC-TROSA), and is a module having a transmitter, a multilevel optical modulator, and a receiver that are integrally mounted therein, for example. The semiconductor laser (LD) with the wavelength locker (WL) and serving as a wavelength-tunable light source is used as a signal light source for the transmitter by being supplied with electric power from the wiring substrate 20 for low frequency signals, and is also used as a local light emission light source for detecting a modulated signal by causing interference with a signal light received by the coherent mixer (MX) forming the receiver. The optical modulator (MD) functions as a multilevel optical modulator by being driven by a driver IC (ICD). The TIA-IC (ICT) has a function of converting an electric current signal output according to signal light received by the balance-type semiconductor light receiving element (PD) into an electric voltage signal and outputting the electric voltage signal. The modulated signal supplied to the driver IC (ICD) and the electric voltage signal output from the TIA-IC (ICT) are input or output to the optical module 900 via the wiring substrate 20 for high frequency signals.

Examples of embodiments and modified examples of the present disclosure have been described above, but these embodiments and modified examples are just examples and are not intended to limit the scope of the disclosure. The above described embodiments and modified examples can be implemented in various other modes, and without departing from the gist of the disclosure, various omissions, substitutions, combinations, and modifications can be made. Furthermore, they may be implemented by modifying, as appropriate, the specifications of the components and shapes, for example (such as, the structures, types, directions, models, sizes, lengths, widths, thicknesses, heights, numbers, arrangements, positions, and materials).

For example, a configuration for increasing connection strength using supporting resin or a supporting member like the fourth, fifth, or sixth embodiment is also applicable to the module of the second, seventh, eighth, or ninth embodiment.

An optical module according to the present disclosure enables electric connection between the optical module and a wiring substrate without the use of lead pins in the related art because: the optical module has a housing having an optical element installed therein, the housing having a box shape; the wiring substrate has been bonded to a part of a surface of a housing part forming the housing; and an electric wiring formed in the wiring substrate or on a surface of the wiring substrate and an electric wiring introduced into the housing part or onto the surface of the housing part have been electrically connected to each other. The optical module is able to be downsized because the downsizing is not constrained by, for example, dimensions of lead pins.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module having a box-shaped housing with an optical element mounted therein, wherein:
    a wiring substrate is bonded to a part of a surface of a housing part of the housing,
    an electric wiring, which is formed in the wiring substrate or on a surface of the wiring substrate, and an electric wiring, which is introduced into the housing part or onto a surface of the housing part, are electrically connected to each other, and
    a bonding supporting member is connected to a front surface or a back surface of the wiring substrate, and the bonding supporting member is bonded to a part of the surface of the housing part with a resin adhesive.

2. An optical module having a box-shaped housing with an optical element mounted therein, wherein:
    a wiring substrate is bonded to a part of a surface of a housing part of the housing,
    an electric wiring, which is formed in the wiring substrate or on a surface of the wiring substrate, and an electric wiring, which is introduced into the housing part or onto a surface of the housing part, are electrically connected to each other, and
    a bonding supporting member having a projection or a pole-shaped portion is connected to a front surface or a back surface of the wiring substrate, and the projection or the pole-shaped portion of the bonding supporting member is engaged with a groove-shaped, dent-shaped, or hole-shaped hollow portion formed in the housing part.

3. The optical module according to claim 2, wherein the projection or the pole-shaped portion of the bonding supporting member is inserted in the groove-shaped, dent-shaped, or hole-shaped hollow portion formed in the housing part, and is bonded with a resin adhesive or solder.

4. An optical module having a box-shaped housing with an optical element mounted therein, wherein:
    a wiring substrate is bonded to a part of a surface of a housing part of the housing,
    an electric wiring, which is formed in the wiring substrate or on a surface of the wiring substrate, and an electric wiring, which is introduced into the housing part or onto a surface of the housing part, are electrically connected to each other, and
    a bonding supporting member is connected to a front surface or a back surface of the wiring substrate, and the bonding supporting member is integrated with a part of the surface of the housing part.

* * * * *